US007750673B2

(12) United States Patent
Ayodhyawasi et al.

(10) Patent No.: US 7,750,673 B2
(45) Date of Patent: Jul. 6, 2010

(54) INTERCONNECT STRUCTURE AND METHOD IN PROGRAMMABLE DEVICES

(76) Inventors: Manuj Ayodhyawasi, 112, Chatrapati Shivaji Nagar, Walmi Road, Bhopal, MP-462016 (IN); Kailash Digari, 401 Gharunda Appts, Sector—Alpha-I, Greater Noida - 201306, UP (IN)

( * ) Notice: Subject to any disclaimer, the term of this patent is extended or adjusted under 35 U.S.C. 154(b) by 73 days.

(21) Appl. No.: 11/261,420

(22) Filed: Oct. 27, 2005

(65) Prior Publication Data

US 2006/0087342 A1    Apr. 27, 2006

(30) Foreign Application Priority Data

Oct. 27, 2004    (IN)    ............... 2114/DEL/2004

(51) Int. Cl.
*H03K 19/177*    (2006.01)
(52) U.S. Cl. ..................... 326/41; 326/39; 326/47
(58) Field of Classification Search ............. 326/37–41, 326/47, 101
See application file for complete search history.

(56) References Cited

U.S. PATENT DOCUMENTS

| 5,498,975 | A | * | 3/1996 | Cliff et al. ................. 326/10 |
| 5,880,598 | A | * | 3/1999 | Duong ....................... 326/41 |
| 6,282,627 | B1 | | 8/2001 | Wong et al. |
| 6,477,688 | B1 | * | 11/2002 | Wallace ...................... 716/10 |
| 6,631,510 | B1 | * | 10/2003 | Betz et al. .................. 716/16 |
| 6,870,396 | B2 | * | 3/2005 | Lien et al. ................... 326/41 |
| 6,934,927 | B2 | * | 8/2005 | Kaptanoglu ................ 716/16 |
| 7,071,732 | B1 | * | 7/2006 | Jang et al. ................... 326/41 |
| 2003/0201795 | A1 | * | 10/2003 | Lien et al. ................... 326/41 |
| 2006/0139055 | A1 | * | 6/2006 | Deshmukh et al. .......... 326/41 |

OTHER PUBLICATIONS

Muhammad I. Masud, FPGA Routing Structures: A Novel Switch Block and Depopulated Interconnect Matrix Architectures, Dec. 1999, Master's Thesis, Department of Electrical and Computer Engineering, University of British Columbia, pp. 21-27, 42-45.*
Lemieux, G., Leventis, P., Lewis, D., "Generating Highly-Routable Sparse Crossbars for PLDs," ACM/SIGDA Int. Symp. on FPGAs, Feb. 2000, pp. 155-164, Monterey, CA.
Masud, M. I., "FPGA routing structures: A novel switch block and depopulated interconnect matrix architectures," Master's thesis, Department of Electrical and Computer Engineering, University of British Columbia, Dec. 1999, pp. 21-27, 42-45.

* cited by examiner

*Primary Examiner*—James H. Cho
*Assistant Examiner*—Christopher Lo (57) ABSTRACT

An improved interconnect structure in programmable devices gives a new dimension to the routing architecture, where architecture is divided into various domains. It includes at least one set of input lines, each set having predetermined number of input lines; an equal number of sets of routing lines, each set of routing lines being connected to a corresponding set of input lines using a switch box; thereby forming domain based routing structures, each domain being disjoint with the other domain. Segregating FPGA routing resources into various independent routing domains is done; each domain providing connectivity to route a signal to a set of sinks.

16 Claims, 9 Drawing Sheets

INTERCONNECT STRUCTURE AND METHOD IN PROGRAMMABLE DEVICES

PRIORITY CLAIM

This application claims priority from Indian patent application No. 2114/Del/2004, filed Oct. 27, 2004, which is incorporated herein by reference.

BACKGROUND

When Integrated Circuits (ICs) were first introduced, they were extremely expensive and were limited in their functionality. Rapid strides in semiconductor technology have vastly reduced the cost while simultaneously increasing the performance of IC chips. However, the design, layout, and fabrication process for a dedicated, custom built IC remains quite costly. This is especially true for those instances where only a small quantity of a custom designed IC is to be manufactured. Moreover, the turn-around time (i.e., the time from initial design to a finished product) can frequently be quite lengthy, especially for complex circuit designs. For electronic and computer products, it is critical to be the first to market. Furthermore, for custom ICs, it is rather difficult to effect changes to the initial design. It takes time, effort, and money to make any necessary changes.

In view of the shortcomings associated with custom IC's, field programmable gate arrays (FPGAs) offer an attractive solution in many instances. Basically, FPGAs are standard, high-density, off-the-shelf ICs, which can be programmed by the user to a desired configuration. Circuit designers first define the desired logic functions, and the FPGA is programmed to process the input signals accordingly. Thereby, FPGA implementations can be designed, verified, and revised in a quick and efficient manner. Depending on the logic density requirements and production volumes, FPGAs are superior alternatives in terms of cost and time-to-market.

An FPGA essentially consists of an outer ring of I/O blocks surrounding an interior matrix of configurable logic blocks. The I/O blocks residing on the periphery of an FPGA are user programmable, such that each block can be programmed independently to be an input or an output and can also be tri-stated. Each logic block typically contains programmable combinatorial logic and storage registers. The combinatorial logic is used to perform Boolean functions on its input variables. Often, the registers are loaded directly from a logic block input, or they can be loaded from the combinatorial logic.

Interconnect resources occupy the channels between the rows and columns of the matrix of logic blocks and also between the logic blocks and the I/O blocks. These interconnect resources provide the flexibility to control the interconnection between two designated points on the chip. Usually, a metal network of lines runs horizontally and vertically in the rows and columns between the logic blocks. Programmable switches connect the inputs and outputs of the logic blocks and I/O blocks to these metal lines (called input & output connection boxes). Crosspoint switches and interchanges at the intersections of rows and columns are used to switch signals from one line to another (called switch boxes). Often, long lines are used to run the entire length and/or breadth of the chip.

The functions of the I/O blocks, logic blocks, and their respective interconnections are all programmable. Typically, a configuration program stored in an on-chip memory controls these functions. The configuration program is loaded automatically from an external memory upon power-up, on command, or programmed by a microprocessor as part of system initialization.

Figure 1:
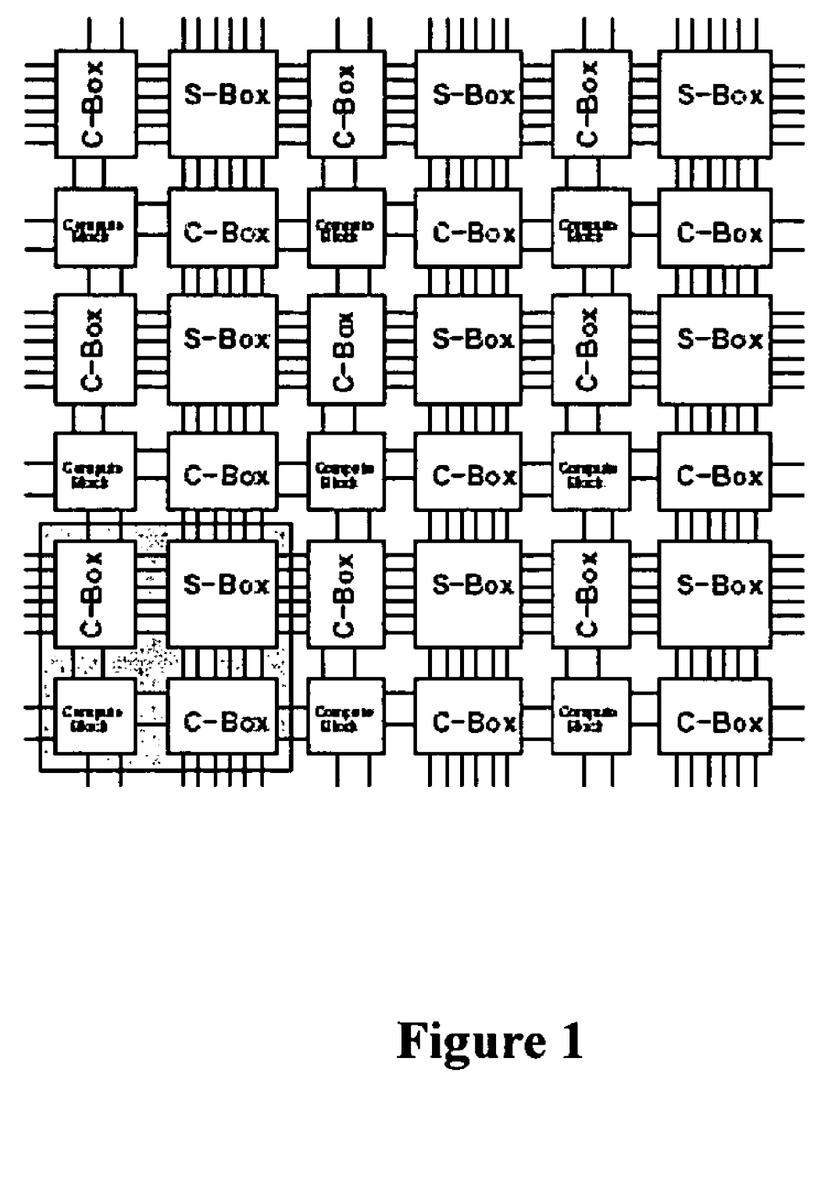
FIG. 1 shows a symmetrical FPGA architecture with basic components.

A typical symmetrical FPGA architecture is shown in the FIG. 1. FIG. 1 shows basic components and their connectivity. FIG. 1 shows a switch box and 4 connection boxes of logic block connecting to a bi-directional single length track routing fabric. The four connection boxes are identical. The Configurable logic block has its inputs connected to the routing fabric via a matrix, usually known as a connection box. Routing channels interact with each other with a matrix, known as a switch box. The switch box can be of different topologies. Recently much work has been concentrated on a superior switch box called Hyper Universal, which provides enhanced routability at the expense of some extra resources.

Figure 2:
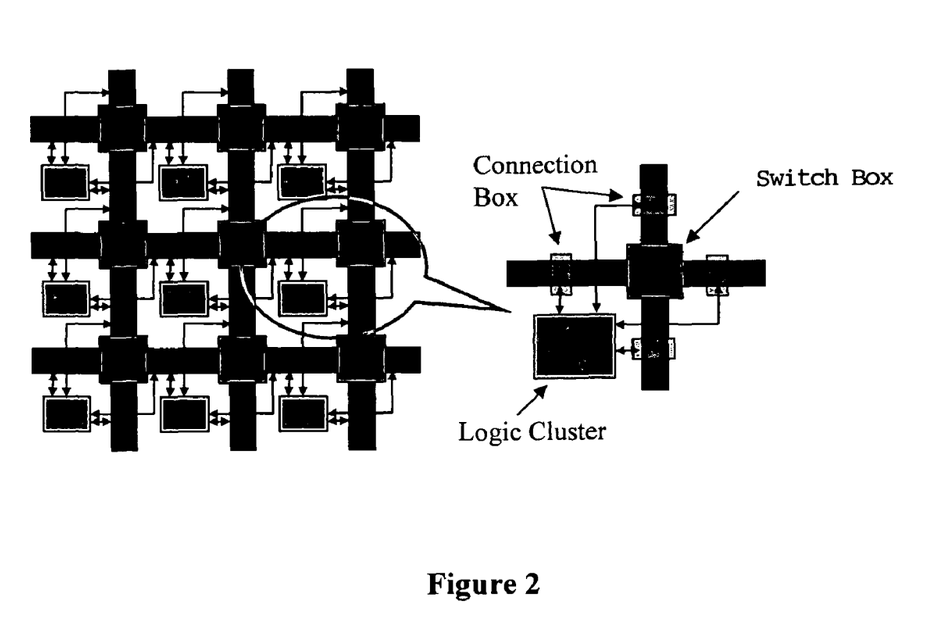
FIG. 2 shows a symmetrical architecture with different connectivity.

With further developments taking place, the connection boxes of a logic cluster shown in FIG. 1 are not in the four adjacent channels but are on all four sides of a particular switch box making the connection box and switch box appear as one single entity as shown in FIG. 2.

Figure 3:
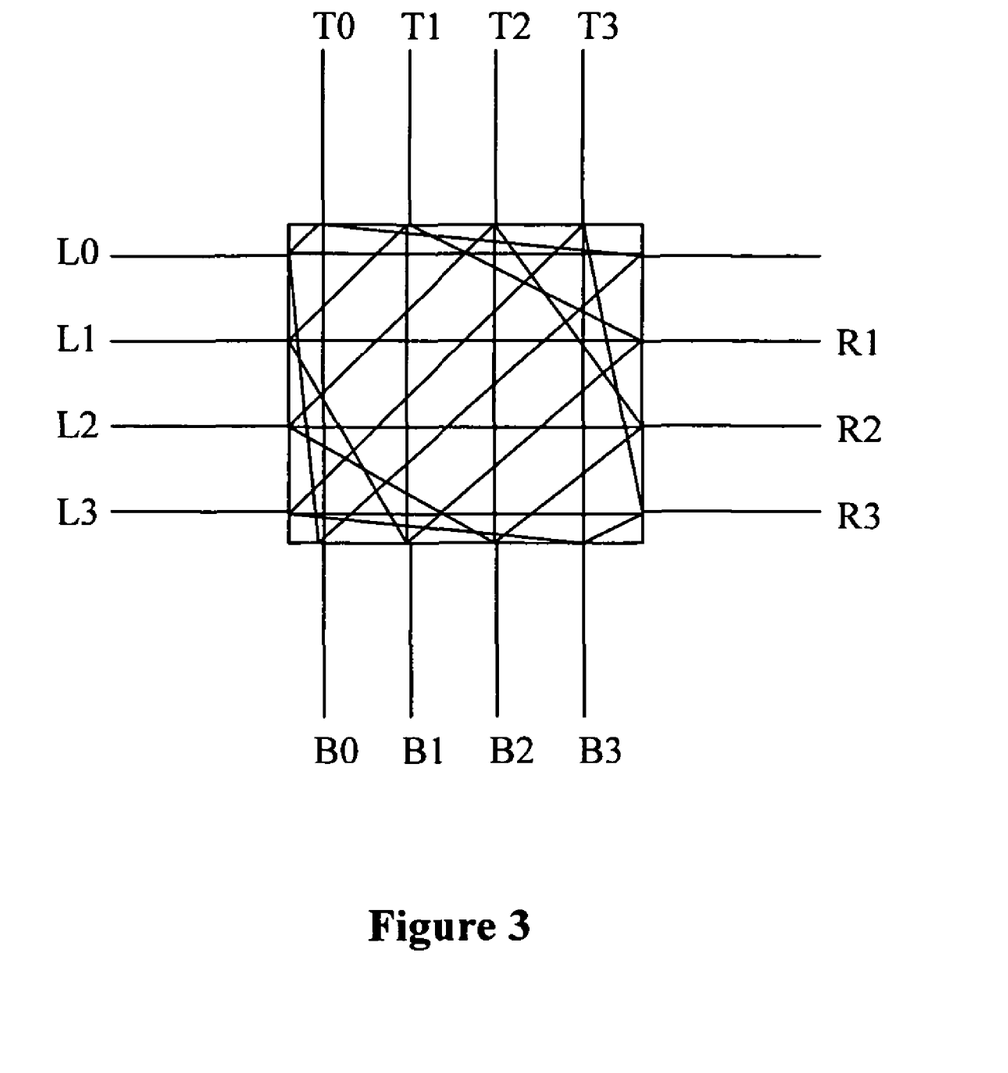
FIG. 3 shows a simple Disjoint Switch Box topology.

The disjoint switch box is very popular because of its simplicity and easy layoutability. A disjoint switch box is shown in FIG. 3. A disjoint switch box has similar one to one connection on all the sides, i.e., line number 1 of side left is connected to line number of 1 of right, top and bottom and so on. Such a switch box makes it easier for a router to predict the routability and because of of fewer number of crisscross connections it is easy to layout in silicon. However a disjoint switch box gives a reduced routability as compared to other switch boxes like Wilton, Universal & Hyper-Universal.

Figure 4:
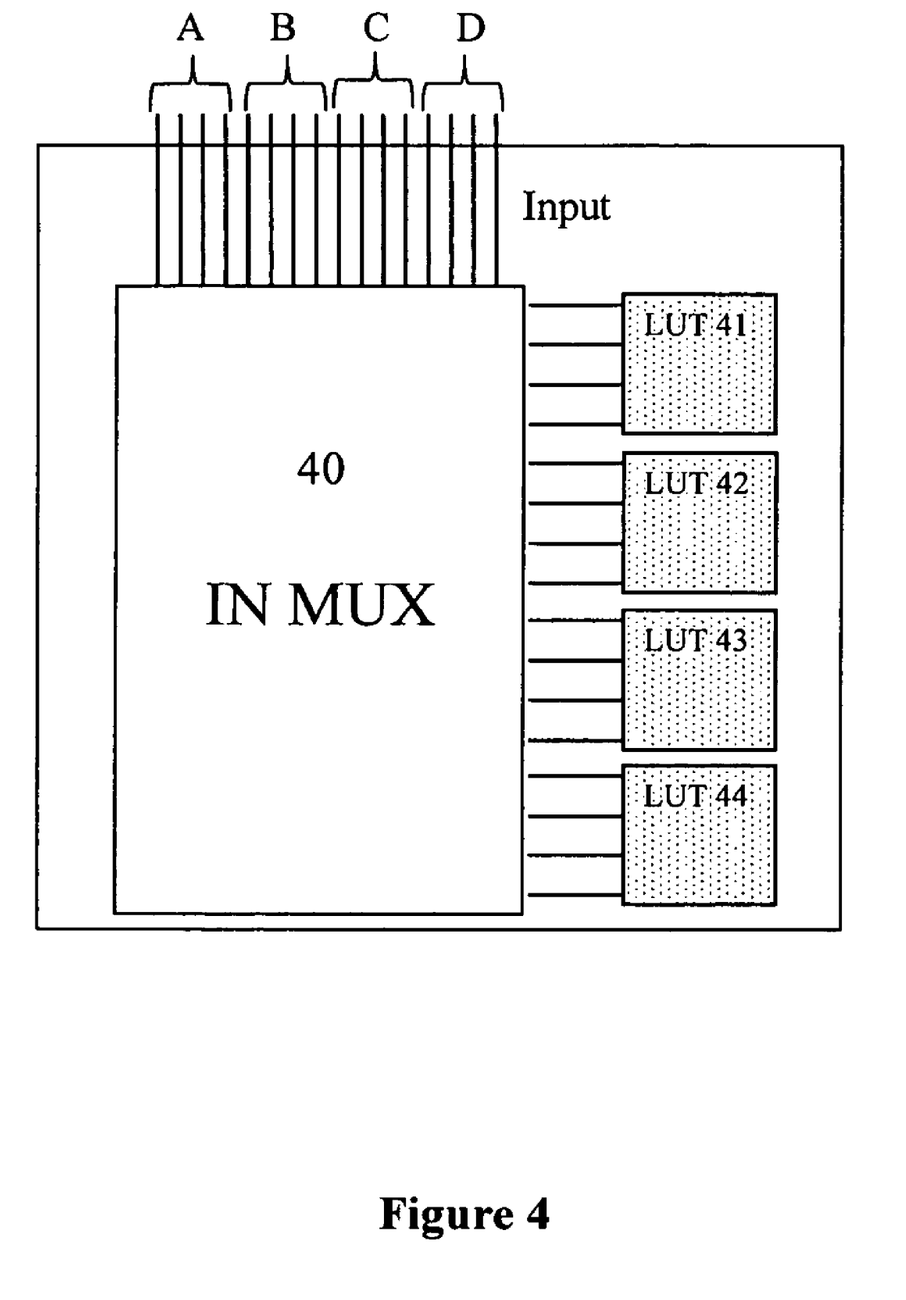
FIG. 4 shows a generic logic cluster with in multiplexer and input sets.

A typical configurable logic block would be as shown in FIG. 4. The logic block shown has a full matrix on the input side of its connectivity with the routing fabric, known as INMUX and internal feedback matrix for merged nets. It could also possibly have a full matrix on the output side to connect to the routing fabric. Generic FPGA structures are referred to in M. I. Masud. FPGA routing structures: A novel switch block and depopulated interconnect matrix architectures. Master's thesis, Department of Electrical and Computer Engineering, University of British Columbia, December 1999.

Another structure is given in G. Lemieux, P. Leventis, and D. Lewis. Generating highly-routable sparse crossbars for PLDs. In ACM/SIGDA Int. Symp. on FPGAs, pages 155-164, Monterey, Calif., February 2000.

But unlike universal switch-boxes, disjoint switch boxes are better with respect to predicting routing and are easy to layout on silicon.

SUMMARY

Various embodiments provide for a domain based routing architecture where routing architecture is divided into various domains.

Various embodiments provide easy routing predictability and improved routing flexibility as well as improved compile times for EDA tools.

In one embodiment, an interconnect structure in programmable devices includes one or more independent groups of input lines, each said group having predetermined number of said input lines; an equal number of groups of routing lines; and a connection mechanism for connecting lines in each input group to the lines in each corresponding group of routing lines and lines of each group of routing lines with the routing lines of their routing line group, thereby forming domain based routing structures, each said domain being disjoint with the other domains.

The output lines of a logic block may be connected to any group of routing lines. The group of routing lines may contain a plurality of routing lines. The connection mechanism may include switch box (s) and connection boxes. Each group of input lines can drive a domain using connection boxes. The one or more independent groups of input lines can drive at least one domain using the routing lines. Each domain may include a switch box. All domains may include a common switch box. The group of input lines may be connected to the address/data lines of a memory in programmable devices. The routing lines may be unidirectional/bi-directional. The switch box may include disjoint switch boxes. The switch box may include universal switch boxes. The switch box may include Wilton switch boxes. The switch box may include hyper universal switch boxes. The programmable device may include an FPGA.

In another embodiment, a method for interconnecting programmable devices includes forming at least one independent group of input lines, each group having a predefined number of said input lines; providing equal number of groups of routing lines, each group comprising plurality of routing lines; and connecting each said group of input lines to a corresponding group of routing lines and lines of each group of routing lines with the routing lines of same group thereby forming a domain based routing structure enhancing software implementation as well as layouts. The group of input lines may be formed depending upon logical equivalence or functionality of input lines.

BRIEF DESCRIPTION OF THE ACCOMPANYING DRAWINGS

The invention will now be described with reference to the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments combine the features of a disjoint switch-box and various other switch-boxes to give a balanced tradeoff of routability, easy layoutability & software friendliness. The shortcomings of disjoint switch box have been overcome by a combination of disjoint and other types of switch boxes to yield a switch-box cluster with ease of layoutability, software friendly structure & increased routability.

Referring to FIG. 4, the IN MUX 40 input is segregated into various sets (A, B, C & D) based on different criteria, such as logical equivalence or functionality. If IN MUX 40 is a full matrix then all inputs of IN MUX 40 are logically equivalent, i.e., there is just one set of inputs at INMUX 40. If there is no IN MUX then different look-up-table (LUT) inputs may form different sets (say a first set for LUT 41 input, a second set for LUT 42 inputs and so on). If there is memory in place of a LUT then address lines may form one set, data lines may form another set and so on.

The domains may not necessarily be created by the connectivity to input matrices but could also be possible in other cases. For example, direct connectivity to the cluster of LUTs can lead to domain formation on the bases of connectivity to a particular LUT, i.e., tracks connected to a particular LUT are of the same domain. In memories, domains can be formed on different criteria, e.g., there could be one domain of data lines, another domain of address lines, yet another domain of control signals and the like.

However in FIG. 4, IN MUX 40 inputs have been segregated into four sets, say A, B, C and D, using any aforesaid method.

Figure 5:
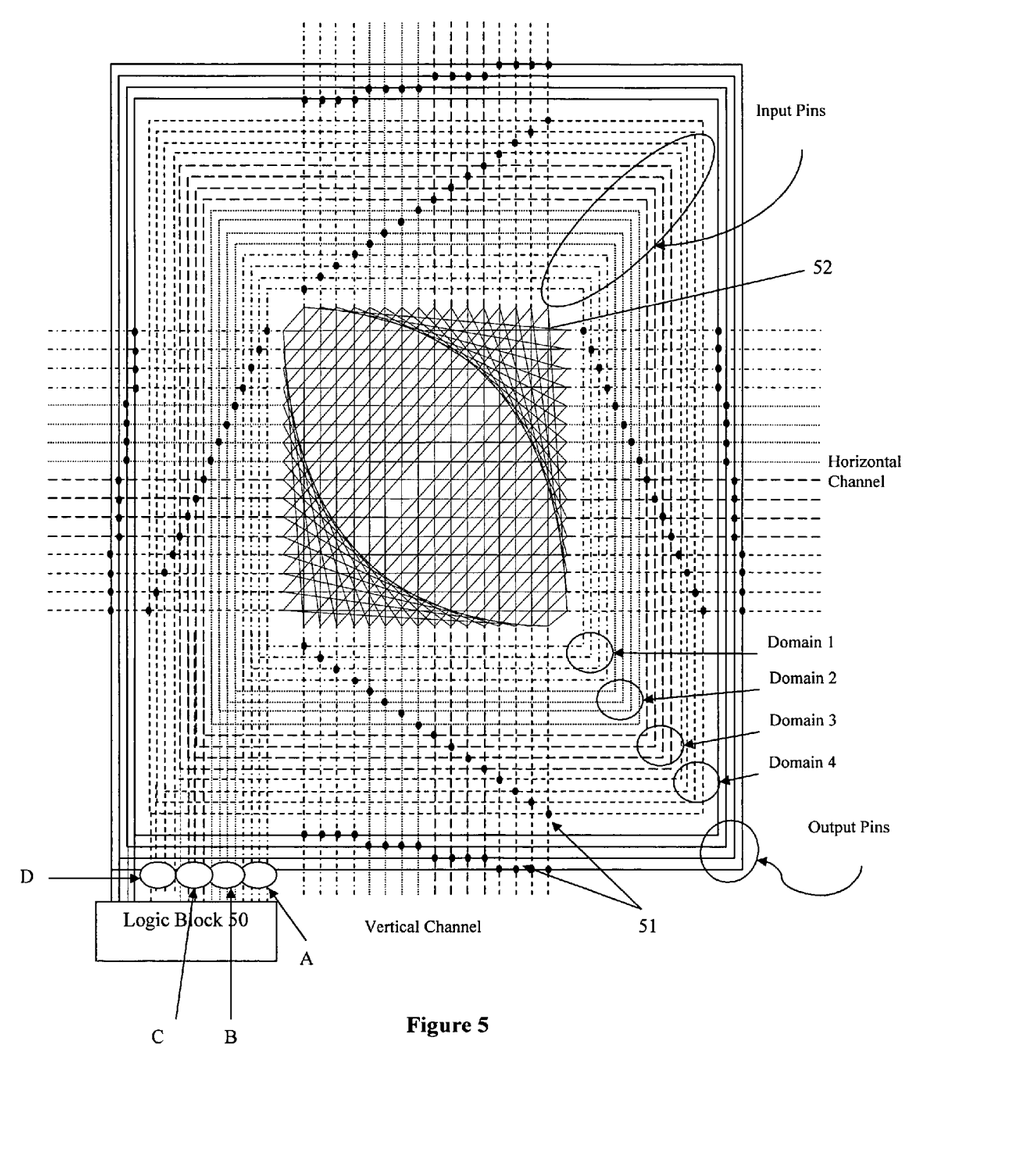
FIG. 5 shows a routing fabric broken in four routing domains in switch box, connection box and in multiplexer for bi-directional routing tracks using a single switch box.

FIG. 5 shows a detailed view of a logic tile. Logic tile contains a logic block 50 (IN MUX is part of the logic block), connection box 51 and switch box 52. All the lines (inputs) of the logic block are divided into four sets A, B, C and D. The inputs are connected to the routing lines, which are again divided into different sets and interact with their corresponding lines on all sides of a switch box thereby forming a domain.

Connection box 51 is designed in such a way that different sets interact with different logic block input sets. In FIG. 4, tracks on each side are divided into four parts and one fourth lines (1 to 4) of each side are connected to set A, another one fourth lines (5 to 8) of each side are connected to set B, another one fourth lines (9 to 12) of each side are connected to set C and remaining one fourth lines (13 to 16) of each side are connected to set D. The routing tracks are divided into four parts as shown, however, they can be divided into any number of sets, usually equal to the number of sets in logic block 50 inputs and each routing track interacts with one input line, but flexibility at the connection box 5 can be changed to any value provided first one fourth of the lines are being connected to set A and so on. FIG. 4 shows one possible method of connecting routing lines to respective sets of input lines on the logic block 50 whereas there may be various other possible methods that can be deployed to achieve the same goal.

The switch box 52 is disjoint in nature, i.e., line number 1 of left is always connected to line number 1 of top, bottom and right and so on for each line and side.

The connection between the lines of input multiplexer, say set A, and routing lines is as follows. The required number of routing lines of the first side are connected to set A of the connection box 51 which, in turn, are connected to the corresponding lines on all other sides of a switch box 52. Thus, all these lines are connected to set A in connection box. In brief, line number 1 will always remain connected to set A on all sides even after passing through switch box and connection box. All lines interacting with set A belong to domain 1, all lines interacting with set B belong to domain 2, all lines interacting with set C belong to domain 3 and all lines interacting with set D belong to domain 4.

Figure 6:
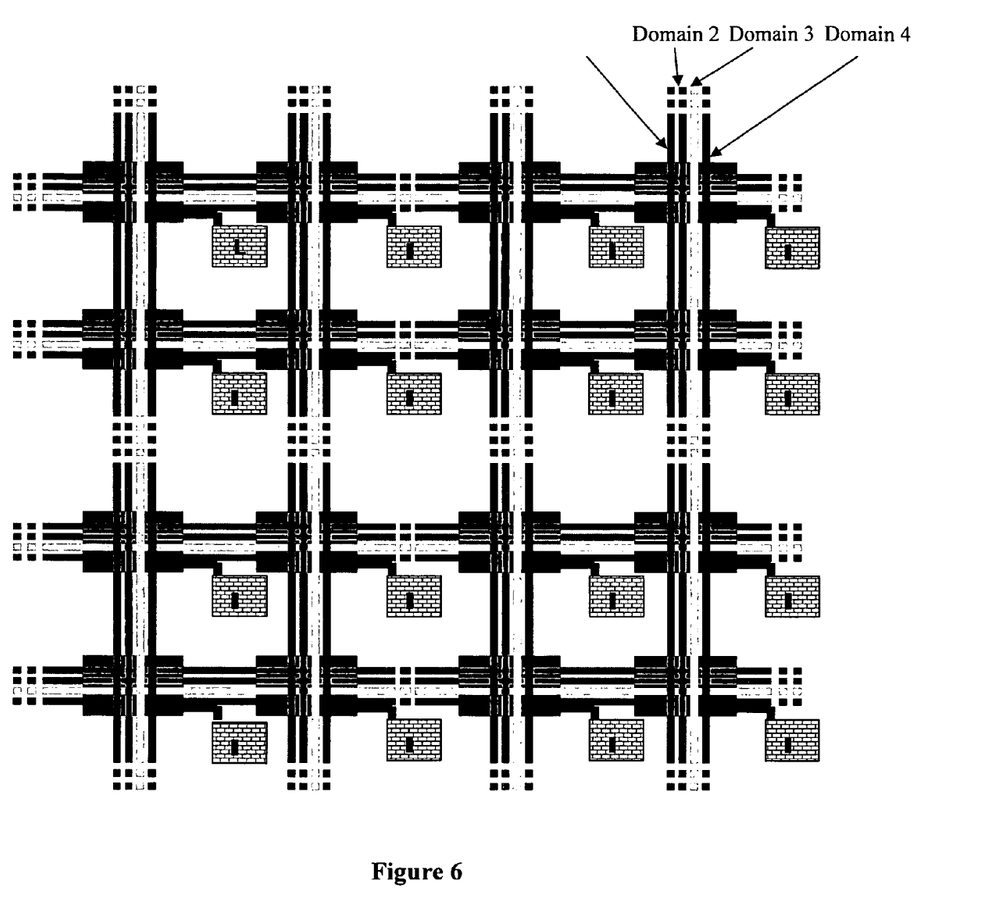
FIG. 6 illustrates a routing fabric broken into four routing domains in whole core.

FIG. 6 shows a whole chip formed by replication of tiles described in FIG. 5 thereby extending domains to whole FPGA fabric.

The combination of "set definition at logic block", "connection box topology" and "switch box topology" forms routing domains and divides the complete routing structure into various domains, which are mutually exclusive.

The biggest benefit of routing domains is achieved during software implementation and silicon implementations. Routing domains have much less connectivity (none in this case as all routing domains are mutually exclusive) with each other, hence logic related to a particular domain can be placed at one place while logic related to another domain can be placed at another place. It gives a high degree of flexibility during silicon routing or "floorplanning." Different domains can be placed separately keeping different silicon issues into consideration and thereby provide better performance of silicon in terms of delay and/or area and/or development efforts.

Also, an FPGA implementation toolset can utilize this feature to improve performance. During routing, software routes nets between source and sink as per track availability of the routing tracks. The sink is available on a particular routing domain (usually just one), which is valid throughout the chip on all sides; the source need not search the track availability on other domains. Rather the source needs to search the track availability in a particular domain, which belongs to sink. Thus, domain based routing architecture reduces search space for software considerably.

Figure 7:
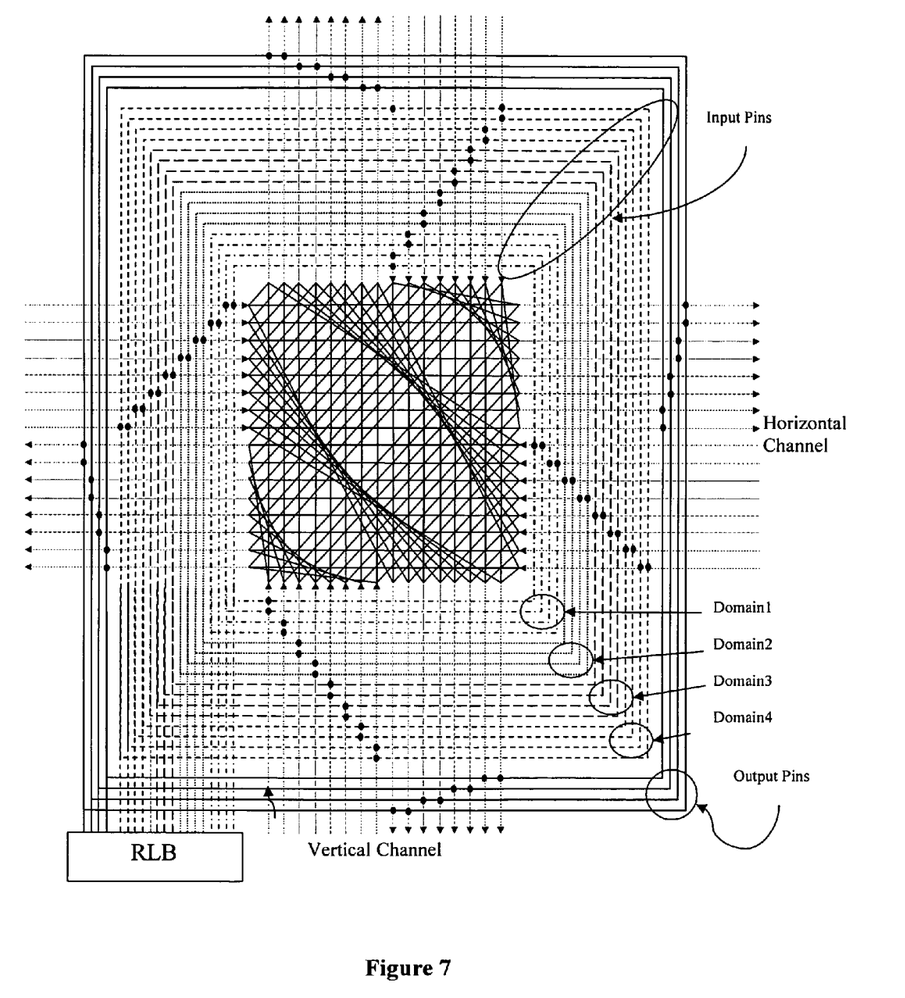
FIG. 7 illustrates a routing fabric broken in four routing domains in switch box, connection box and IN MUX for uni-directional routing tracks.

FIG. 7 is an example of a domain based routing structure in the case of unidirectional lines. In unidirectional switch box, an incoming line of a domain in one side drives the corresponding outgoing line an all other sides and so on for each side and incoming/outgoing lines. So a domain contains logic block input sets and incoming & outgoing lines with appropriate switch box and connection topology.

Figure 8:
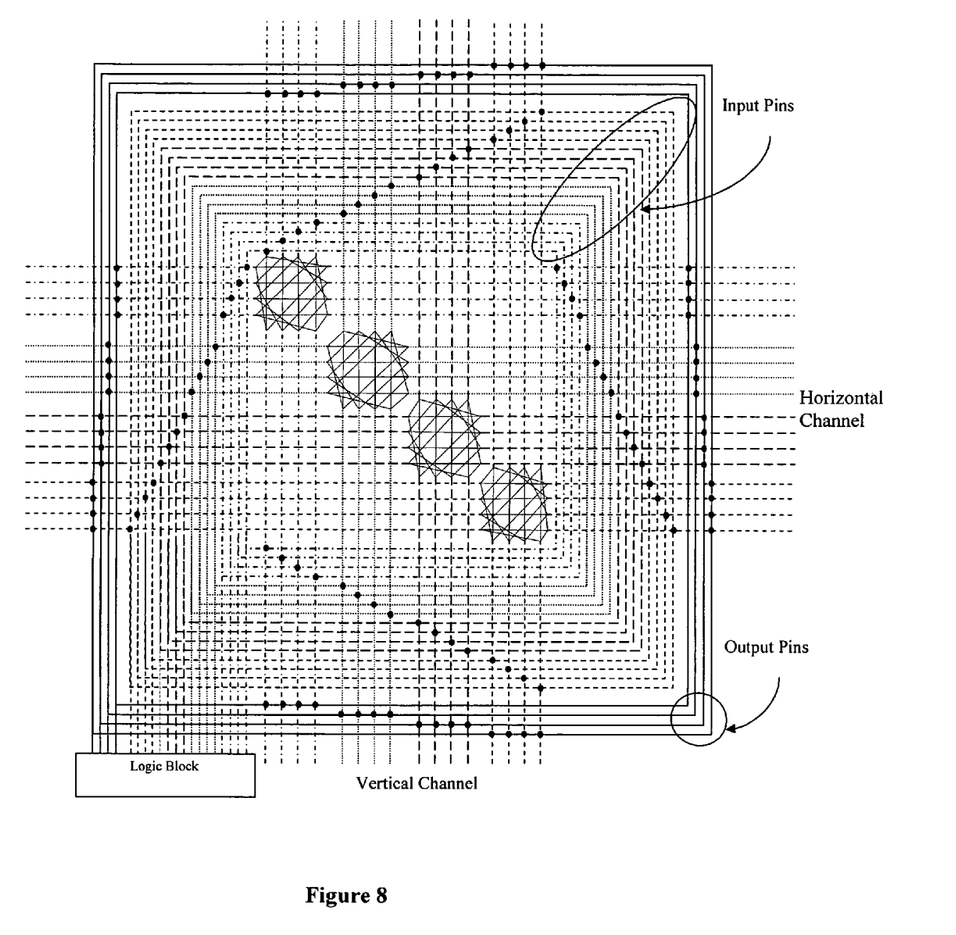
FIG. 8 re-layout of FIG. 5 using multiple switch boxes.

FIG. 8 shows another embodiment that shows the routing lines have been divided into domains and the whole switch box is a cluster of disjoint switch boxes. Each switch box is connected to a particular set of routing lines/tracks. The segregation of tracks into four domains is based on their connectivity to the input matrices and switch matrix connectivity. In this embodiment, neither intra-domain nor inter-domain switching is possible with respect to tracks. To increase the routability of such switch boxes while maintaining the domain concept the architecture can be depicted as shown in FIG. 9 using universal switch box.

To enhance routability, other switch boxes like Wilton, Universal & Hyper-Universal can be used in place of a disjoint switch box. Another embodiment of invention makes a tradeoff between Disjoint and other high routability switch boxes to get the best of both types of switch boxes.

Figure 9:
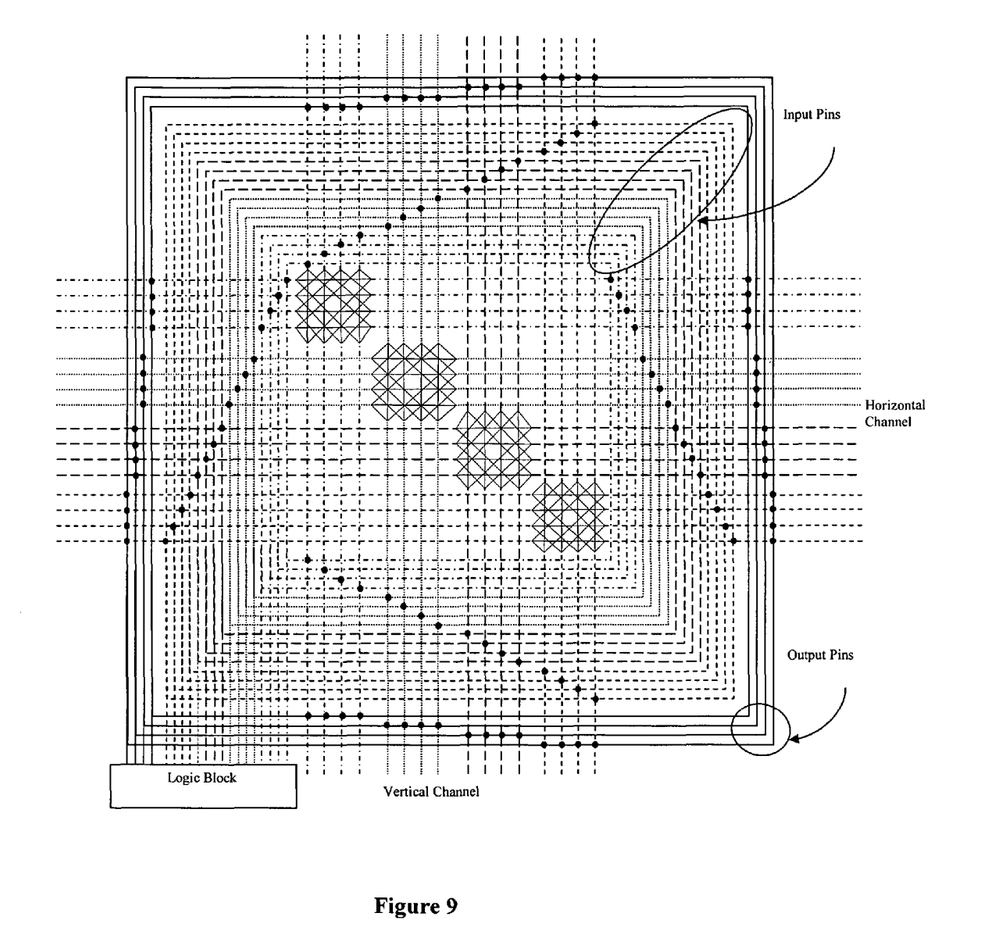
FIG. 9 shows a universal switch boxes doing intra domain switching with a routing fabric broken into four domains.

In FIG. 9 the switch box is a cluster of mutually exclusive universal switch boxes. Universal switch boxes give flexibility in layout as the switch box can be broken in mutually exclusive parts and placed apart as per convenience, as described earlier. The router knows for sure that a signal in one domain is restricted to the domain. So predictability is better. This in turn helps to reduce expansion times as well as provides high routability (switching tracks is possible in a domain).

Said figure is only an example of a possible structure of a "Clustered switch box" which preserves the domain concept. Instead of a universal switch box a Wilton, Hyper-Universal or a combination of such switch boxes or a new switch box can be used.

Embodiments of the invention can be applied to a routing fabric for FPGAs based on LUTs, multiplexers, ULMs, or CPLDs etc., or memory elements. Anyone skilled in the art can easily see its applicability to afore mentioned architectures.

FPGAs or other programmable devices including embodiments of the present invention may be contained in a variety of different types of electronic systems, such as computer systems.

From the foregoing it will be appreciated that, although specific embodiments of the invention have been described herein for purposes of illustration, various modifications may be made without deviating from the spirit and scope of the invention.

We claim:

1. An interconnect structure for programmable devices, comprising:
   one or more independent groups of input lines, wherein each said group of input lines has a predetermined number of input lines;
   an equal number of groups of routing lines; and
   a switch box cluster for connecting said input lines in each input group to routing lines in each corresponding group of routing lines and connecting each said routing line in each group of routing lines with other routing lines within their routing line group to form multiple domains, wherein there is no connectivity between the multiple domains, and wherein the switch box cluster includes at least one disjoint switch box and at least one Universal, Wilton, or Hyper-Universal switch box.

2. The interconnect structure as recited in claim 1, wherein said one or more independent groups of input lines drive at least one domain using said routing lines.

3. The interconnect structure as recited in claim 1, wherein each said domain includes a switch box.

4. The interconnect structure as recited in claim 1, wherein said one or more independent groups of input lines are connected to address and data lines of a memory in programmable devices.

5. The interconnect structure as recited in claim 1, wherein said routing lines are both unidirectional and bi-directional.

6. The interconnect structure as recited in claim 1, wherein said programmable devices include Field Programmable Gate Arrays.

7. A method for interconnecting programmable devices, comprising:
   forming at least one independent group of input lines, wherein each group of input lines comprises a predefined number of input lines;
   forming an equal number of groups of routing lines, wherein each group of routing lines comprises a plurality of routing lines; and
   connecting said input lines in each group of input lines to a corresponding group of routing lines and connecting said routing lines in each group of routing lines with other routing lines within their routing line group to form multiple domains, wherein there is no connectivity between the multiple domains.

8. The method recited in claim 7, wherein said group of input lines is formed depending on logical equivalence or functionality of said input lines.

9. An interconnect structure for a programmable device, comprising:
   a plurality of domains, wherein each domain includes at least one group of input lines and at least one group of routing lines; and
   a structure operable to connect input lines in each said group of input lines to routing lines in a corresponding group of routing lines, and to connect routing lines in each said group of routing lines with other routing lines within their routing line group;

wherein there is no connectivity between the input and routing lines of each said domain to the input and routing lines of other domains in the interconnect structure.

10. An electronic system, comprising:

a programmable device, wherein the programmable device includes an interconnect structure that comprises a plurality of domains, and wherein each domain includes at least one group of input lines and at least one group of routing lines; and a structure operable to connect input lines in each said group of input lines to routing lines in a corresponding group of routing lines, and to connect routing lines in each said group of routing lines with other routing lines contained within their routing line group, wherein there is no connectivity between the input and routing lines of each said domain to the input and routing lines of other domains.

11. The electronic system as recited in claim 10, wherein the programmable device comprises a Field Programmable Gate Array.

12. A method of interconnecting components within a programmable device, the method comprising:

defining at least one independent group of input lines, wherein each group of input lines comprises a number of input lines;

defining an equal number of groups of routing lines, wherein each group of routing lines comprises a number of routing lines;

generating instructions for interconnecting each said group of input lines to a corresponding group of routing lines;

generating instructions for interconnecting said routing lines in each group of routing lines to other routing lines within their routing line group;

using the corresponding instructions, interconnecting each said group of input lines to said corresponding group of routing lines to form domains, wherein there is no connectivity between the domains; and using the corresponding instructions, interconnecting said routing lines in each group of routing lines to other routing lines within their routing line group.

13. The method as recited in claim 12, wherein defining at least one independent group of input lines comprises defining said groups of input lines as a function of the logical equivalence of input lines within the programmable device.

14. The method as recited in claim 12, wherein defining at least one independent group of input lines comprises defining said groups of input lines as a function of the functionality of input lines within the programmable device.

15. The method as recited in claim 12, wherein defining at least one independent group of input lines comprises defining said groups of input lines as a function of where the logic circuitry associated with each said group of input lines is to be physically located within the programmable device.

16. An interconnect structure comprising: a plurality of mutually exclusive routing domains, wherein each routing domain includes at least one group of input lines and at least one group of routing lines; and a structure operable to connect input lines in each said group of input lines to routing lines in a corresponding group of routing lines, and to connect routing lines in each said group of routing lines with other routing lines within their routing line group, wherein there is no connectivity between the plurality of mutually exclusive routing domains.

* * * * *